United States Patent
Inamasu et al.

(10) Patent No.: US 7,030,313 B2
(45) Date of Patent: Apr. 18, 2006

(54) THIN FILM SOLAR CELL AND METHOD OF MANUFACTURING THE SAME

(75) Inventors: Takashi Inamasu, Sakai (JP); Masafumi Shimizu, Kitakatsuragi-gun (JP); Kenji Wada, Takarazuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 512 days.

(21) Appl. No.: 10/301,587

(22) Filed: Nov. 22, 2002

(65) Prior Publication Data

US 2003/0127127 A1    Jul. 10, 2003

Related U.S. Application Data

(62) Division of application No. 09/758,265, filed on Jan. 12, 2001, now Pat. No. 6,512,171.

(30) Foreign Application Priority Data

| | | | |
|---|---|---|---|
| Jan. 13, 2000 | (JP) | | 2000-004644 |
| Jan. 14, 2000 | (JP) | | 2000-006766 |
| Jan. 10, 2001 | (JP) | | 2001-002262 |

(51) Int. Cl.
*H01L 31/18* (2006.01)
*H01L 31/075* (2006.01)

(52) U.S. Cl. .................. 136/255; 136/249; 136/261; 136/258; 438/97; 438/74; 427/74; 427/588; 427/590

(58) Field of Classification Search ............... 136/255, 136/249, 261, 258; 438/97, 74; 427/74, 427/588, 590
See application file for complete search history.

(56) References Cited

U.S. PATENT DOCUMENTS

| | | | |
|---|---|---|---|
| 4,683,146 A | 7/1987 | Hirai et al. | 427/583 |
| 5,977,477 A * | 11/1999 | Shiozaki | 136/256 |
| 6,337,224 B1 * | 1/2002 | Okamoto et al. | 438/69 |
| 6,495,392 B1 * | 12/2002 | Sakai et al. | 438/96 |
| 6,512,171 B1 * | 1/2003 | Inamasu et al. | 136/258 |
| 6,521,826 B1 * | 2/2003 | Wada | 136/255 |

FOREIGN PATENT DOCUMENTS

| | | | |
|---|---|---|---|
| JP | 58-124281 A * | 7/1983 |
| JP | 62-165912 A * | 7/1987 |
| JP | 11-145498 A * | 5/1999 |
| WO | WO 99/25029 | 5/1999 |
| WO | WO 99/25029 A1 * | 5/1999 |

OTHER PUBLICATIONS

U.S. Appl. No. 09/758,265 filed Jan. 12, 2001.
Matsuda, "Growth Mechanism of Microcrystalline Silicon Obtained from Reactive Plasms", Elsevier Science S.A., Thin Solid Films, 1999, pp. 1-6.

(Continued)

*Primary Examiner*—Alan Diamond
(74) *Attorney, Agent, or Firm*—Nixon & Vanderhye P.C.

(57) ABSTRACT

A thin film solar cell comprises a p-layer, an i-layer and an n-layer formed in this order as a pin junction on a substrate in which the p-layer and the i-layer are thin silicon films each containing a crystalline component, and the p-layer contains p-type impurities of 0.2 to 8 atom % and has a thickness of 10 to 200 nm.

5 Claims, 2 Drawing Sheets

OTHER PUBLICATIONS

Rai-Choudhury et al, Growth and Characterization of Polycrystalline Silicon, *J. Electrochem. Soc.*, Solid-State Science and Technology, vol. 120, No. 12, Dec. 1973, pp. 1761-1766.

Cowher et al, "Chemical Vapor Deposited Polycrystalline Silicon", *J. Electrochem. Soc.*, Solid-State Science and Technology, vol. 119, No. 11, Nov. 1972, pp. 1565-1570.

Fortmann et al, "Microstructure of Polycrystalline Silicon Having Varied Orientation Structures", Conferences of Japanese Society of Applied Physics, Summary, 1p-ZS-2, Sep., 1999, p. 787.

Kamiya, "Orientation Control of Polycrystalline Silicon on Glass by Low Temperature Plasma Enhanced CVD", Conferences of Japanese Society of Applied Physics. Summary, 2p-ZM-9, Autumn, 1999, p. 32.

* cited by examiner

THIN FILM SOLAR CELL AND METHOD OF MANUFACTURING THE SAME

CROSS-REFERENCES TO RELATED APPLICATIONS

This application is a division of application Ser. No. 09/758,265, filed Jan. 12, 2001 (now U.S. Pat. No. 6,512,171), the entire content of which is hereby incorporated herein by reference in this application.

BACKGROUND OF THE INVENTION

1. Field of the Invention

The present invention relates to a thin film solar cell and a method of manufacturing the same.

2. Description of Related Art

Today, future aggravation of supply and demand of petroleum and the like that have been utilized as a main energy source is concerned. The use of petroleum involves generation of $CO_2$ which causes global warming, so that solar cells have drawn attention as an alternative energy source.

The solar cells employ a semiconductor pn junction as a photoelectric conversion layer for converting optical energy into electric power and silicon is mainly utilized as a semiconductor material comprising the pn junction.

Crystalline silicon solar cells utilizing materials including monocrystalline silicon and the like are advantageous in photovoltaic conversion efficiency and have already been put into practical use. However, they are problematic in that material supply is not stable, a cell area is insufficient and costs are high.

Further, according to eager researches and developments in recent years, amorphous solar cells utilizing amorphous silicon which have been practically utilized as the solar cells in consumer devices are now getting into practical use for power generation since they are advantageous to realize large area and low costs.

However, the photovoltaic conversion efficiency of the amorphous solar cells is as low as about 10%, which has not yet reached the photovoltaic conversion efficiency of 15 to 20% obtained by the crystalline solar cells. Further, amorphous silicon causes a phenomenon called Staebler-Wronski effect which increases defect density in the film as being irradiated with light. Accordingly, decrease of the photovoltaic conversion efficiency as time elapse is inevitable.

In connection with the above, researches and developments have eagerly been conducted in recent years with respect to solar cells utilizing a thin film of crystalline silicon, e.g., polycrystalline silicon and microcrystalline silicon, which exhibits high reliability and high photovoltaic conversion efficiency of the crystalline silicon solar cells as well as good efficiency in material consumption, large area and low costs of the amorphous silicon solar cells.

Plasma enhanced CVD method is one method of manufacturing a thin crystalline film to be used in the solar cells. In particular, a thin crystalline silicon film formed on a glass substrate by plasma enhanced CVD method at a low temperature not higher than 600° C. has drawn attention because experiences that have gone through in the manufacture of the amorphous solar cells are utilized.

However, the photovoltaic conversion efficiency of the solar cell manufactured with use of the thin crystalline silicon film prepared in the above method is on the same level as that of the solar cell of amorphous silicon.

The reason of the low photovoltaic conversion efficiency of the solar cell using the thin crystalline silicon film is mainly a low crystal fraction and an insufficient crystal orientation of the thin polycrystalline silicon film formed on a substrate of other material than silicon.

It is known that the crystal fraction is increased by selecting a formation temperature or increasing the ratio of hydrogen for diluting silane in a reaction gas as described in Thin Solid Films, vol. 337 (1999), p 1, for example.

It is also known that the crystal orientation is improved by selecting a suitable pressure and a composition of the reaction gas or adding particular elements.

For example, according to documents ("Growth and Characterization of Polycrystalline Silicon" J. Electrochem. Soc. SOLID-STATE SCIENCE AND TECHNOLOGY, Vol. 120(1973), No. 12, p. 1761 and "Chemical Vapor Deposited Polycrystalline Silicon" J. Electrochem. Soc. SOLID-STATE SCIENCE AND TECHNOLOGY, Vol. 119(1972), No. 11, p. 1565), a thin silicon film having a preferential crystal orientation in the direction of <110> is obtained by thermal CVD method using silane added with diborane at 680° C. and 650° C., respectively. Further, according to a document (Conferences of Japanese Society of Applied Physics, Autumn 1999, Summary 1p-ZS-2, p. 787), the thin silicon film having the preferential crystal orientation in the direction of <110> is obtained by plasma enhanced CVD method using silane added with diborane at about 200° C.

Further, a document (Conferences of Japanese Society of Applied Physics, Autumn 1999, Summary 2p-ZM-9, p. 32) has reported that the preferential crystal orientation in the directions <110> and <100> of the thin silicon film is controlled by plasma enhanced CVD method at 200 to 300° C. while changing the ratio between a material gas of silicon fluoride ($SiF_4$) and a diluent gas of hydrogen.

Further, it is known that where the ratio of hydrogen for diluting silane in the reaction gas is relatively high, the crystal fraction becomes high and the crystal orientation in a specific direction becomes weak. On the other hand, where the ratio of diluent hydrogen is relatively low at the same temperature as the above, the crystal fraction becomes low but the crystal orientation in the direction of <110> becomes high.

Concretely speaking, even if the high crystal fraction is obtained by adjusting the conditions for forming the intrinsic photoelectric conversion layer, the ratio of integrated intensity of an X-ray diffraction peak at (220) with respect to an X-ray diffraction peak at (111) is equal or less than 2 when it is deposited to a thickness of about 500 nm as a single layer. Further, even if the high crystal orientation that allows the ratio of the integrated intensity of the X-ray diffraction peak at (220) with respect to that at (111) of 5 or more, the crystal fraction thereof will be reduced. The crystal properties of these thin crystalline silicon films are unsatisfactory to be used as the intrinsic photoelectric conversion layer for the solar cells.

In connection to the above, there has been proposed a technique in which a conductive layer formed under the intrinsic photoelectric conversion layer is utilized as a layer for controlling the crystal properties of the intrinsic photoelectric conversion layer (e.g., see Japanese Unexamined Patent Publication No. Hei 11 (1999)-145498).

The Publication refers to a thin conductive film of microcrystalline silicon employed as the conductive layer directly below the intrinsic photoelectric conversion layer. The impurity concentration which determines a conductivity type of the thin conductive film of microcrystalline silicon is in the range of 0.05 to 9 atom % and the thickness thereof is in the range of 1 to 10 nm or 1 to 30 nm. The crystal properties of the photoelectric conversion layer are enhanced by forming it on the thus constructed conductive layer.

However, in the Publication, the conductive layer of n-type is considered in detail, but the conductive layer of p-type is exemplified in only one example. Therefore, characteristics of the p-type conductive layer suitable as the layer for controlling the crystal properties of the intrinsic photoelectric conversion layer and a construction of the thin film solar cell using the p-type conductive layer are not satisfactorily explained.

The conductivity type of the layer formed at the bottom of the intrinsic photoelectric conversion layer greatly influences the structure of the solar cell. In comparison between electrons which are majority carriers in the n-layer and holes which are majority carriers in the p-layer, the holes are poorer in mobility and life. Therefore, it is well known that greater photovoltaic conversion efficiency is advantageously obtained by arranging the p-layer to receive light.

Accordingly, where the n-layer is formed at the bottom of the intrinsic photoelectric conversion layer, the solar cell employs in general a substrate type structure in which light enters from the opposite side to the substrate. In the substrate type structure, the photoelectric conversion element is located to be irradiated with light so that a surface protection is additionally required to prevent deterioration of the element due to exposure to air. The surface protection is often formed of a film of acrylic resin or fluoric resin. However, problems of the reduction of transmissivity due to denaturation by light irradiation for a long term, insufficient moisture-resistance and the generation of ridging on the surface are still unsolved.

On the other hand, where the p-layer is formed at the bottom of the intrinsic photoelectric conversion layer, and then a transparent substrate such as a glass substrate is utilized, the solar cell structure of a superstrate type can be employed in which light enters from the transparent substrate. In particular, where the glass substrate is used, the problems of reduced transmissivity and low moisture-resistance are solved. That is, it is more preferable to apply the solar cell of the superstrate type structure to a solar electric power generator for domestic use which is installed outside.

Thus, for wide use of the solar cell, it is extremely important to make sure of favorable characteristics of the p-layer which functions as a layer controlling the crystal properties of the intrinsic photoelectric conversion layer and a favorable structure of the thin film solar cell utilizing the p-layer as the bottom layer of the intrinsic photoelectric conversion layer.

SUMMARY OF THE INVENTION

According to the present invention, the crystal orientation, e.g., in the direction of <110>, of the p-layer formed under the intrinsic photoelectric conversion layer in the solar cell is highly enhanced. As a result, the crystal orientation, in particular in the direction of <110>, of the intrinsic photoelectric conversion layer deposited thereon is enhanced. Further, both of the high crystal orientation and the high crystal fraction are simultaneously given to the intrinsic photoelectric conversion layer, whereby a thin film solar cell allows higher photovoltaic conversion efficiency and a method of manufacturing the same.

The present invention is provided with a first thin film solar cell comprising a p-layer, an i-layer and an n-layer formed in this order as a pin junction on a substrate in which the p-layer and the i-layer are thin silicon films each containing a crystalline component, and the p-layer contains p-type impurities of 0.2 to 8 atom % and has a thickness of 10 to 200 nm.

Further, the present invention provides a second thin film solar cell comprising a p-layer, an i-layer and an n-layer formed in this order as a pin junction on a substrate in which the p-layer and the i-layer are thin silicon films each containing a crystalline component, and the p-layer shows the integrated intensity ratio of an X-ray diffraction peak at (220) with respect to an X-ray diffraction peak at (111) greater than that of the i-layer deposited as a single layer to the same thickness on a substrate.

The present invention further provides a method of manufacturing the first and second thin film solar cells wherein the p-layer and the i-layer are continuously formed by plasma enhanced CVD method while varying a gas flow rate, wherein the surface of the p-layer is exposed to atomic hydrogen after the formation of the p-layer or wherein the p-layer is formed of a film which shows the integrated intensity ratio of the X-ray diffraction peak at (220) with respect to the X-ray diffraction peak at (111) of 5 or more, when deposited as a single layer to a thickness of 500 nm or more on a substrate.

Still the present invention provides the third thin film solar cell comprising a bottom layer and an upper layer formed directly on the bottom layer in a multi-layered pin junction or nip junction in which both layers contain a crystalline component, respectively, wherein the bottom layer shows an orientation greater than an orientation of the upper layer deposited as a single layer to the same thickness on a substrate.

Further, the present invention provides a fourth thin film solar cell comprising a bottom layer and an upper layer formed directly on the bottom layer in a multi-layered pin junction or nip junction in which both layers contain a crystalline component, respectively, wherein the upper layer is formed of a film which shows a crystal fraction greater than a crystal fraction of the bottom layer, when deposited as a single layer on a substrate, and a stacked structure of the bottom layer and the upper layer formed directly on the bottom layer in the pin junction or the nip junction shows the integrated intensity ratio of an X-ray diffraction peak at (220) with respect to an X-ray ray diffraction peak at (111) of 5 or more.

Moreover, the present invention provides a method of manufacturing the above-mentioned thin film solar cell, wherein the bottom layer is formed by plasma enhanced CVD method using a VHF frequency band as an excitation frequency.

Further, the present invention further provides a solar cell module comprising any one of the first to the fourth thin film solar cells.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The first and second thin film solar cells of the present invention are mainly comprised of a p-layer, an i-layer and an n-layer deposited in this order as a pin junction on a substrate, respectively.

A p-type silicon layer (a p-layer) containing a crystalline component formed as a bottom layer of a photoelectric conversion layer contains (i) p-type impurities of about 0.2 to 8 atom % and has a thickness of about 10 to 200 nm.

The concentration of the p-type impurities in the p-layer used as the photoelectric conversion layer of the solar cell is generally in the range of 0.01 to 10 atom %. Where the p-type impurity concentration is 0.2 atom % or more, a crystal orientation of the pin junction remarkably increases and as a result, high photovoltaic conversion efficiency is obtained. On the other hand, where the p-type impurity concentration exceeds 8 atom %, the crystallization of the p-layer is insufficient and the p-type impurities are diffused into the i-layer during the formation of the i-layer, which results in a reduced photovoltaic conversion efficiency.

Further, carriers generated in the p-layer by photoabsorption cannot be extracted as electric current, so that it is preferred that the p-layer is formed as thin as possible in order to obtain favorable characteristics of the solar cell, in particular great short-circuit current. However, where the thickness is smaller than 10 nm, the photovoltaic conversion efficiency remarkably decreases. In particular, an open-circuit voltage and a fill factor decrease significantly.

Alternatively, the p-type silicon layer shows (ii) the ratio of integrated intensity of an X-ray diffraction peak at (220) with respect to an X-ray diffraction peak at (111) greater than that of the i-layer deposited as a single layer on a substrate to have the same thickness as the p-type silicon layer. The ratio of the integrated intensity of the X-ray diffraction peak at (220) with respect to the X-ray diffraction peak at (111) ($I_{220}/I_{111}$, hereinafter merely referred to as "integrated intensity ratio") is expressed as an index for indicating orientation in the direction of <110>. That is, where the integrated intensity ratio of the p-layer is greater than that of the i-layer, it signifies that the orientation in the direction of <110> of the p-layer is greater than that of the i-layer. This stands, for example, between the p-layer deposited to a desired thickness (e.g., about 500 nm) on a substrate to be mentioned later and the i-layer deposited to the same thickness as the p-layer on a substrate (e.g., a substrate preferably the same kind of the substrate on which the p-layer is formed). In particular, where the p-layer is deposited to a thickness of 500 nm or more as a single layer, the p-layer preferably has the orientation greater than that of the i-layer. For example, the integrated intensity ratio of the p-layer is preferably 1 or more, 3 or more, 5 or more, 7 or more, 12 or more, or 20 or more. The substrate may be a substrate of the same kind as that used in the thin film solar cell of the present invention, or may be a different substrate, e.g., a flat substrate generally used in the field of thin film solar cells and semiconductor devices. The flat substrate used in the semiconductor devices and that of the thin film solar cells on which electrodes are not yet formed are preferable (hereinafter this signifies the same).

It is preferred that not only the p-layer but also the i-layer deposited thereon has the preferential crystal orientation in the direction of <110>, that is, a stacked structure of the p-layer and the i-layer preferably shows the preferential crystal orientation in the direction of <110> through the entire thickness thereof.

The phrase "containing a crystalline component" signifies that the p-layer is entirely formed of a monocrystalline silicon, a microcrystalline silicon or a polycrystalline silicon. Alternatively, the p-layer partially contains a monocrystalline component, a microcrystalline component or a polycrystalline component. Where the p-layer is made of multilayers, at least one layer of the multilayers may be of a layer of monocrystalline silicon, microcrystalline silicon or polycrystalline silicon, or it may partially contain a monocrystalline component, a microcrystalline component or a polycrystalline component. Where the p-layer partially contains the crystalline component, the p-layer preferably shows a crystal fraction of about $Ic/(Ic+Ia)>0.4$. The crystal fraction is an evaluation index and expressed by the ratio of the crystalline silicon peak $Ic/(Ic+Ia)$ obtained from a height Ic of a peak in Raman scattering spectrum of about 520 $cm^{-1}$ corresponding to the crystalline silicon and a height Ia of a peak in Raman scattering spectrum of about 480 $cm^{-1}$ corresponding to the amorphous silicon. The value may not always signify strictly the volume ratio of the crystalline component in the thin film.

Examples of the p-type impurities include elements of group III in the periodic table, e.g., boron, aluminum, gallium and the like. The p-type impurities are preferably doped uniformly in the whole silicon layer, but may be doped to show a concentration distribution along the direction of the thickness of the silicon layer.

The p-layer may be formed as a layer containing a crystalline component by plasma enhanced CVD method. The plasma enhanced CVD method may be performed with an electric power at a high frequency band from RF to VHF. ECR plasma enhanced CVD method may also be used and a combination of them is also available. In the plasma enhanced CVD method, for example, a gas mixture of a material gas, a dopant gas and an optional diluent gas may be used. The material gas may be a gas containing silicon, such as $SiH_4$, $Si_2H_6$, $SiF_4$, $SiH_2Cl_2$, $SiCl_4$. The dopant gas may be a gas containing an atom which can be a p-type dopant such as $B_2H_6$. The diluent gas may be an inert gas such as $H_2$, Ar, He, Ne, Xe and the like. The mixing ratio between the material gas and the dopant gas is suitably adjusted in the ratio of about 1:0.001 to 1:1 by volume. The ratio may be maintained constant or varied. Further, the mixing ratio between the material gas and the diluent gas is suitably in the ratio of about 1:1 to 1:100 by volume while being maintained constant or varied.

The plasma enhanced CVD method is performed under the conditions of a frequency of about 10 to 200 MHz, an electric power of several W to several kW, an in-chamber pressure of about 10 to 3000 Pa and a substrate temperature from about room temperature to 600° C., for example. In particular, the plasma enhanced CVD method is preferably performed under the conditions which allow to obtain the preferential crystal orientation in the direction of <110>, especially to obtain the integrated intensity ratio of 5 or more when the p-layer is deposited to a thickness of 500 nm or more as a single layer on a substrate.

The p-layer may be formed of a single layer or multilayers. Where the multilayers are employed, a part of the multilayers may not necessarily satisfy the above-mentioned conditions such as the p-type impurity concentration, the thickness and the crystal orientation. Further, the p-layer satisfying the above-mentioned conditions may not necessarily contact the i-layer directly. For example, even if the p-layer satisfying the above-mentioned conditions is formed first and then another p-layer which does not satisfy the above conditions is deposited thereon, the lower p-layer enhances the crystal properties of the upper p-layer. Therefore, the crystal properties of the i-layer formed on the upper p-layer can also be improved.

Further, during a period after the formation of the p-layer and before the formation of the i-layer, the surface of the p-layer is preferably exposed to atomic hydrogen. The exposure to atomic hydrogen may be performed, for example, by decomposing a hydrogen gas to atomic hydrogen by plasma enhanced CVD method or catalyst enhanced CVD method and irradiating the atomic hydrogen to the p-layer surface. Where the plasma enhanced CVD method is utilized, the exposure is performed under the same conditions as described above except that the hydrogen gas is used. The exposure may be performed for several seconds to several tens of seconds. Thus, the crystal properties of the i-layer formed on the p-layer further improve, which allows the efficiency of the solar cell to be highly improved.

The i-type silicon layer (i-layer) contains a crystalline component but does not substantially show the conductivity type of p-type or n-type. The i-layer may express extremely weak p-type or n-type conductivity type as long as the function of photoelectric conversion is not deteriorated. The phrase "contains a crystalline component" holds the same meanings as in the p-layer mentioned above. The thickness of the i-layer may be, for example, about 0.2 to 10 µm. The i-layer is provided as a layer containing a crystalline component by plasma enhanced CVD method using substantially the same gas as used for forming the p-layer except that the dopant gas is not used. The i-layer is formed under substantially the same conditions as those for forming the p-layer.

The p-layer and the i-layer are formed as layers each containing a crystalline component under the different conditions as mentioned above, respectively, but may be formed continuously by plasma enhanced CVD method while varying the gas flow rate and optionally varying other conditions. Accordingly, the p-layer and the i-layer are formed as an integrated layer deposited without suspension. Further, since the continuous formation of the p-layer and the i-layer utilizes the same film formation chamber, while separate chambers have been used in general, costs for equipment are reduced and throughput is improved.

The n-type silicon layer (n-layer) is not particularly limited as long as it is an n-layer generally utilized in the pin junction in the solar cell. For example, it may be formed of a silicon layer containing the crystalline component as described above or an amorphous silicon layer. Impurities to be used as donors may be phosphorus, arsenic, antimony and the like and the concentration thereof may be about $10^{18}$ to $10^{20}$ ions/cm$^3$. The thickness of the n-layer may be, for example, about 10 to 100 nm.

The pin junction formed on the substrate preferably shows the integrated intensity ratio of the X-ray diffraction peak at (220) with respect to that at (111) of 1 or more, 3 or more, 5 or more, 7 or more, 12 or more, or 20 or more.

The third and fourth thin film solar cells of the present invention comprise a plurality of pin junctions or nip junctions deposited on a substrate, and a bottom layer of the pin junctions or the nip junctions and a layer formed directly on the bottom layer are made of thin silicon films each containing a crystalline component. The pin junction is constructed of a p-layer, an i-layer and an n-layer formed in this order from the bottom and the nip junction is constructed of an n-layer, an i-layer and a p-layer deposited in this order from the bottom.

The pin junction or the nip junction may be made of multilayers. For example, the p-layer, the i-layer and the n-layer may be formed individually as a single layer or multilayers, or one or two of the p-, i- and n-layers are made of multilayers and the others may be a single layer. Alternatively, the p-layer and a part of the i-layer, a part of the p-layer and the i-layer, the i-layer and the n-layer, the n-layer and a part of the i-layer, a part of the n-layer and the i-layer, the i-layer and the p-layer may be formed as a single layer, respectively. Accordingly, the bottom layer and the upper layer formed directly on the bottom layer in the pin junction or the nip junction may not necessarily have the same conductivity type.

The bottom layer may be a single p-layer or a single n-layer, for example. Where either of the p-layer and the n-layer is made of multilayers, the bottom layer may be a layer located at the bottom of the multilayers. Where the p-layer and the i-layer or the p-layer and a part of the i-layer are formed as a single layer, the single layer will be the bottom layer. Where the n-layer and the i-layer or the n-layer and a part of the i-layer are formed as a single layer, the layer will be the bottom layer. The single layer signifies that the two layers do not greatly vary in crystal fraction and crystal orientation along the film stacking direction so that they can be regarded as a single layer.

The upper layer formed directly on the bottom layer may be a single i-layer where the bottom layer is a single p-layer (or a single n-layer), or it may be one of the plural i-layers which is located the closest to the p-layer (or the n-layer). Where the bottom layer is a layer located at the bottom of the plural p-layers (or n-layers), the upper layer may be a p-layer (or an n-layer) formed directly on the bottom layer. Where the bottom layer is the p-layer (or the n-layer) and the i-layer formed as a single layer or the p-layer (or the n-layer) and a part of the i-layer formed as a single layer, the upper layer may be an n-layer (or a p-layer) or an i-layer formed directly on the single layer.

In particular, the bottom layer is preferably the p-layer and the upper layer formed directly on the bottom layer is preferably an undoped silicon layer. Examples of the p-type impurities and the n-type impurities are the same as those mentioned above. The p-type or n-type impurities may preferably be doped uniformly in the p-layer or the n-layer, but for example, they may be doped to show a concentration distribution along the direction of the thickness of the layer. The p-type or n-type concentration in the silicon layer may be, for example, as the same above. Where the bottom layer and the upper layer are the p-layer and the undoped silicon layer, respectively, the n-layer may be formed of a silicon layer containing a crystalline component as mentioned later or may be an amorphous layer as long as it is an n-layer generally used in the pin junction of the solar cell.

The bottom layer and the upper layer are made of thin silicon films each containing a crystalline component. The phrase "containing a crystalline component" holds the same meanings as mentioned above. The thicknesses of the layers are not particularly limited as long as a desired crystal orientation can be obtained; for example, the bottom layer and the upper layer may be about 10 to 200 nm and about 0.2 to 10 µm, respectively. It is preferred that the thicknesses of the bottom layer and the upper layer correspond to those of the p-layer and the i-layer, respectively. In this case, the n-layer suitably has a thickness of about 10 to 100 nm.

In the thin film solar cell according to the present invention, (iii) the bottom layer has a greater orientation than that of the upper layer deposited as a single layer to the same thickness as the bottom layer on a substrate. The integrated intensity ratio ($I_{220}/I_{111}$) can be an index for expressing the orientation, e.g., in the direction of <110>. The above-mentioned relationship of the orientation between the bottom layer and the upper layer stands, for example, when the bottom layer is deposited to a desired thickness (e.g., about 500 nm or more) on a substrate to be mentioned later and the upper layer is deposited as a single layer to the same thickness as the bottom layer on a substrate (e.g., a substrate preferably the same kind of the substrate on which the bottom layer is formed).

In particular, it is preferred that the orientation of the bottom layer is greater than that of the upper layer when the bottom layer is deposited to the thickness of 500 nm or more as a single layer. In this case, the orientation preferably shows the integrated intensity ratio of 5 or more, or greater than 7. Where such an orientation is shown, the orientation of the pin junction or the nip junction to be finally obtained in the thin film solar cell will be equal to or greater than that of the upper layer formed as a single layer. Accordingly, the stacked construction of the bottom layer and the upper layer formed directly on the bottom layer preferably shows the integrated intensity ratio of 5 or more, 7 or more, 12 or more, or 20 or more through the entire thickness thereof. Thus, the bottom layer is formed under suitable formation conditions to have a suitable thickness so that the orientation thereof will be greater than that of the upper layer deposited to the same thickness as a single layer on a substrate.

Alternatively, (iv) the upper layer, when deposited as a single layer on a substrate, shows the crystal fraction be greater than that of the bottom layer. The definition of the crystal fraction is the same as mentioned above. For example, where the crystal fraction of the bottom layer is about 0.5 to 0.7, the crystal fraction of the upper layer will be about 0.7 to 0.9. The upper layer is formed under suitable formation conditions to have a suitable thickness so as to show the crystal fraction greater than that of the bottom layer when deposited as a single layer on a substrate. The integrated intensity ratio is defined as described above.

Still alternatively, (v) the stacked structure of the bottom layer and the upper layer formed directly on the bottom layer, the bottom layer or the upper layer in the pin junction or the nip junction shows the integrated intensity ratio of the X-ray diffraction peak at (220) with respect to that at (111) of 5 or more.

In addition to the above mentioned items (iii) and/or (iv) and/or (v), the bottom layer and/or the upper layer, when deposited to a thickness of 500 nm or more as a single layer on a substrate, shows the preferential crystal orientation in the direction of <110>. The preferential crystal orientation in the direction of <110> is defined as mentioned above.

The bottom layer and the upper layer are formed as layers each containing a crystalline component by plasma enhanced CVD method. Examples of the plasma enhanced CVD method are the same as mentioned above. In particular, plasma enhanced CVD method utilizing a frequency exceeding 13.56 MHz is preferable. Specifically, the bottom layer is preferably formed by plasma enhanced CVD method utilizing a VHF frequency band as an excitation frequency. The above-mentioned material gas, optional dopant gas and/or diluent gas are selectively utilized.

The conditions of the plasma enhanced CVD method are suitably adjusted within the above-mentioned range. The orientation and the crystal fraction of the silicon layer are controlled by suitably adjusting the above-mentioned conditions. Therefore, it is preferable to suitably combine the conditions in which a desired orientation and crystal fraction are obtained.

The substrate applicable to the thin film solar cell of the present invention may be any substrate as long as it entirely supports and reinforces the thin film solar cell and has heat-resistance. Examples thereof include glass; heat-resistive polymer films such as of polyimide, PET, PEN, PES, Teflon; stainless steel (SUS), aluminum and the like. If the thin film solar cell receives light from the substrate side, the substrate is preferably transparent. The substrate suitably has a thickness with suitable strength, weight and the like, e.g., a thickness of about 0.1 to 30 mm. The surface of the substrate may have irregularities.

The substrate may be combined with an insulating film, a conductive film or a buffer layer, or optionally one or more of them depending on the use of the substrate. In general, an electrode made of a conductive material is formed between the substrate and the p-layer or the n-layer located at the bottom, and on the n-layer or the p-layer located at the top.

The electrode is not particularly limited and may be formed of a single layer or multilayers of a metal such as gold, platinum, silver, copper, aluminum, nickel, chromium, tungsten, iron, molybdenum and the like or of a transparent conductive material such as $SnO_2$, $InO_2$, ZnO, ITO and the like. Where light enters from the substrate of the thin film solar cell, the conductive electrode on the substrate side is preferably transparent. Alternatively, where the light enters from the opposite side to the substrate, the conductive electrode on the opposite side to the substrate is preferably transparent. The thickness thereof is not particularly limited and may be about 0.1 µm to 2 µm, for example. The electrode is formed on the substrate by sputtering, vacuum vapor deposition or the like. The electrode, in particular the transparent conductive electrode, preferably has irregularities on its surface. It is more preferred that the irregularities have a root mean square RMS of its height in the range of about 25 to 600 nm and $\tan\theta$ in which $\theta$ is an angle of inclination in the range of about 0.07 to 0.20. Further, a metal electrode, for example, in the shape of a comb, may be formed as a collector on the electrode provided on the n-layer or the p-layer located at the top. The metal electrode may be formed of the same conductive materials as mentioned above.

In a preferred embodiment of the thin film solar cell according to the present invention, one or more sets of the transparent electrode, the p-layer, the i-layer and the n-layer are formed in this order on the transparent substrate and the light enters from the substrate. Further, one or more of a buffer layer, an intermediate layer, a conductive layer, an insulating layer and a protective layer may optionally be provided between the substrate and the p-layer, the i-layer or the n-layer.

The thin film solar cell of the present invention may have only one pin junction or nip junction on the substrate or repetitive multiple pin junctions connected in parallel or series, arranged or stacked. Further, the thin film solar cell may constitute a solar cell module by arranging or stacking a plurality of them or together with thin film solar cells of amorphous silicon.

Hereinafter, the thin film solar cell of the present invention and the method of manufacturing the same will be described with reference to the drawings.

EXPERIMENTAL EXAMPLE

On glass substrates of about 3 mm thick, various thin crystalline silicon films were formed under the condition A in which the preferential orientation would increase, and the condition B in which the crystal fraction would increase as shown in Table 1. Then, the preferential orientation and the crystal fraction were measured. The results are shown in Table 2.

TABLE 1

| | $SiH_4$ (sccm) | $H_2$ (sccm) | $B_2H_6$ (sccm) | Substrate temperature (° C.) | Applied power (W) | Pressure (Pa) |
|---|---|---|---|---|---|---|
| Condition A | 4 | 40 | 0.1 | 140 | 25 | 33 |
| Condition B | 5 | 90 | 0 | 200 | 50 | 40 |

In Table 2, the Preferential orientation was expressed as the integrated intensity ratio $I_{220}/I_{111}$ of an X-ray diffraction peak at (220) with respect to an X-ray diffraction peak at (111). The crystal fraction was expressed as a peak of crystalline silicon $Ic/(Ic+Ia)$ obtained from a height Ic of a peak in Raman scattering spectrum of about 520 cm$^{-1}$ corresponding to the crystalline silicon and a height Ia of a peak in Raman scattering spectrum of about 480 cm$^{-1}$ corresponding to the amorphous silicon. The value does not directly indicate the volume ratio of a crystalline component with respect to an amorphous component, but merely functions as an index for evaluating the crystal fraction (hereinafter the value signifies the same). Further, the values shown in Table 2 were obtained from the entire thin crystalline silicon film formed as a single layer or multilayers under the conditions A and B. The order of stacking and thicknesses of the multilayers are indicated in the section of conditions (thickness) in Table 2 as the conditions for the upper layer (the thickness of the upper layer)/the conditions for the bottom layer (the thickness of the bottom layer).

TABLE 2

| Samples | Conditions (Thickness) | preferential Orientation $I_{220}/I_{111}$ | Crystal fraction $Ic/(Ic + Ia)$ |
|---|---|---|---|
| Sample 1 | A (150 nm) | 3.3 | 0.56 |
| Sample 2 | A (300 nm) | 6.6 | 0.58 |
| Sample 3 | A (500 nm) | 11.0 | 0.58 |
| Sample 4 | B (150 nm) | 1.0 | 0.76 |
| Sample 5 | B (300 nm) | 2.2 | 0.78 |
| Sample 6 | B (500 nm) | 3.6 | 0.78 |
| Sample 7 | B (400 nm)/ A (100 nm) | 11.0 | 0.78 |
| Sample 8 | A (400 nm)/ B (100 nm) | 7.3 | 0.58 |

From the results shown in Table 2, it is found that the thin film formed under the conditions A showed the preferential orientation increased depending on the film thickness. The preferential orientation of the thin film of the same thickness obtained under the conditions B in which the crystal fraction would increase was extremely low as compared with that of the thin film formed under the conditions A. That is, the thin film formed under the conditions B was a thin polycrystalline silicon film in which no actual preferential orientation but a so-called random orientation was observed. The thin film formed under the conditions A in which the preferential orientation would increase showed lower crystal fraction as compared with that of the thin film formed under the conditions B.

In the multilayers in which a layer was formed under the conditions B on a bottom layer formed under the conditions A, the preferential orientation and the crystal fraction were extremely high. The preferential orientation was substantially the same as that of a thick film entirely formed under the conditions A. The crystal fraction was substantially the same as that of a film entirely formed under the conditions B.

On the other hand, where the multilayers include a layer formed under the conditions of A on a bottom layer formed under the conditions B, the crystal fraction was lower than that of a film formed under the conditions A and the preferential orientation was lower than that of a film entirely formed under the conditions B.

From these results, it is found that where the bottom layer is formed under the conditions in which high preferential orientation is given but the crystal fraction is low, and then an upper layer is formed thereon under the conditions in which high crystal fraction is given but the preferential orientation is low, the intrinsic photoelectric conversion layer takes over the high preferential orientation of the bottom layer but does not the low crystal fraction. Thus, multilayers that satisfy both of the high preferential orientation and the high crystal fraction can be obtained.

EXAMPLE 1

In this example, the thin film solar cell shown in FIG. 1 was manufactured in the following steps.

On a glass substrate 21 of 3 mm thick, a $SnO_2$ film of 500 nm thick was formed by sputtering as a transparent conductive film 22 to prepare a substrate 28.

On the transparent conductive film 22, a thin film of p-type silicon (a p-layer) 23 containing a crystalline component was deposited to a thickness of 25 nm by RF plasma enhanced CVD method at 13 MHz under gas flow rates of 4 sccm for $SiH_4$, 0.1 sccm for $B_2H_6$ and 40 sccm for $H_2$, a substrate temperature of 140° C., an applied power of 25 W and a pressure of 27 Pa. As shown in Table 3, where the p-layer was deposited to a thickness of 500 nm as a single layer on the glass substrate, the crystal fraction thereof was 0.58 and the integrated intensity ratio of the X-ray diffraction peak at (220) to that at (111) was 11. The concentration of boron in the p-layer was 0.5 atom % according to a measurement by secondary ion mass spectroscopy (SIMS).

Then, on the p-layer 23, a thin intrinsic silicon film (an i-layer) 24 containing a crystalline component was deposited to a thickness of 1.5 μm by RF plasma enhanced CVD method at 13 MHz under gas flow rates of 5 sccm for $SiH_4$ and 90 sccm for $H_2$, a substrate temperature of 200° C., an applied power of 100 W and a pressure of 40 Pa. The deposition rate of the film was 36 nm/min. As shown in Table 3, when the i-layer was deposited to a thickness of 500 nm as a single layer on the glass substrate, the crystal fraction was 0.82 and the integrated intensity ratio of the X-ray diffraction peak at (220) to that at (111) was 0.8. Further, when the i-layer was deposited to a thickness of 1.5 μm as a single layer on the glass substrate, the crystal fraction thereof was 0.82 and the integrated intensity ratio of the X-ray diffraction peak at (220) to that at (111) was 0.9. That is, where the i-layer used in this example was deposited as a single layer, it did not show a preferential crystal orientation but showed a so-called random orientation.

On the i-layer 24, a thin film of n-type silicon (an n-layer) 25 was deposited to a thickness of 15 nm by RF plasma enhanced CVD method under gas flow rates of 4 sccm for SiH$_4$, 0.01 sccm for PH$_3$ and 100 sccm for H$_2$, a substrate temperature of 190° C., an applied power of 25 W and a pressure of 33 Pa.

As shown in Table 3, the crystal fraction of the thus formed pin junction was 0.82 and the integrated intensity ratio of the X-ray diffraction peak at (220) to that at (111) was 4.

In this example and other examples and comparative examples to be mentioned below, the p-, i- and n-layers were deposited in separate deposition chambers unless mentioned. While the deposition of the p-, i- and n-layers was not performed, the deposition chambers, substrate inlets, substrate outlets and substrate carriers in the chambers are evacuated under vacuum to reach a pressure of not more than 10$^{-4}$ Pa.

On the n-layer 25 a ZnO film of 50 nm thick was formed by sputtering as a back reflective layer 26 and an Ag film of 400 nm thick was formed by sputtering as a back electrode 27.

Characteristics of the thus manufactured thin film solar cell of a superstrate type in which light enters from the glass substrate 21 were checked as shown in Table 4. The obtained solar cell element had an efficient irradiation area of 1 cm$^2$. The photovoltaic conversion efficiency was measured after irradiating pseudo-sunbeam of AM 1.5 and 100 mW/cm$^2$ at 50° C. for 500 hours to verify deterioration of the solar cell element through light irradiation. The measured photovoltaic conversion efficiency was equal to that before 500 hours, and thus deterioration was not observed.

EXAMPLES 2–3

Figure 1:
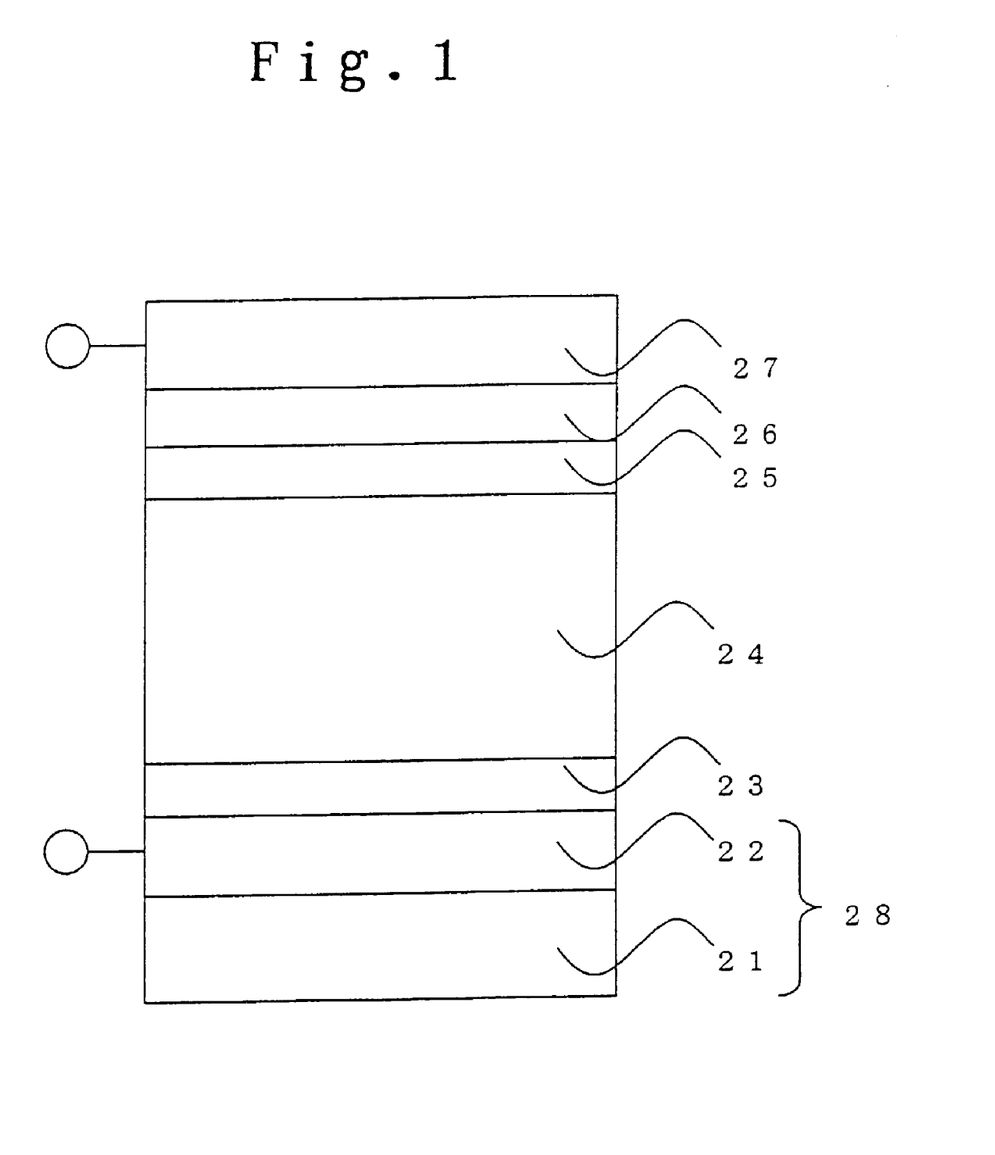
FIG. 1 is a schematic sectional view illustrating a major part of an example of a thin film solar cell according to an embodiment of the present invention.

Thin film solar cells of Examples 2 and 3 were formed as shown in FIG. 1 in substantially the same manner as Example 1 except that the crystal properties of the i-layer 24 were varied and their characteristics were checked as shown in Table 4 so as to evaluate the improvement of the crystal properties of the i-layer caused by the p-layer located under the i-layer. Characteristics of a single i-layer and the pin junction were checked as shown in Table 3 in the same manner as Example 1.

In Example 2, the i-layer 24 was formed under the same conditions described in Example 1 except that the applied power of 50 W was employed. The rate of the film formation was 18 nm/min. When the i-layer was formed to a thickness of 1.5 μm as a single layer on the glass substrate, the crystal fraction thereof was 0.78 and the integrated intensity ratio of the X-ray diffraction peak at (220) to that at (111) was 6.4. In Example 3, the i-layer 24 was formed under the same conditions as Example 2 except that the gas flow rate of SiH$_4$ was changed to 3 sccm. The rate of the film formation was 12 nm/min. When the i-layer was formed to a thickness of 1.5 μm as a single layer on the glass substrate, the crystal fraction thereof was 0.80 and the integrated intensity ratio of the X-ray diffraction peak at (220) to that at (111) was 4.2. Thus, the crystal properties of the single i-layer were varied. The i-layers of Examples 2 and 3 exhibited the crystal fraction nearly equal to that of the i-layer of Example 1 but had a preferential orientation in the direction of <110>.

From Table 3, it is found that when the single i-layer exhibited the preferential crystal orientation, the pin junction also showed the preferential crystal orientation which was remarkably improved. Further, Table 4 shows that the photovoltaic conversion efficiency was more enhanced in the thin film solar cell including the pin junction with the thus improved preferential crystal orientation.

EXAMPLES 4–5

Thin film solar cells of Examples 4 and 5 were formed as shown in FIG. 1 in substantially the same manner as Examples 1 and 2 except that the crystal properties of the p-layer 23 were varied. Then, characteristics of the thin film solar cells were checked as shown in Table 4 so as to evaluate the improvement of the crystal properties of the i-layer caused by the p-layer located under the i-layer. Characteristics of a single p-layer and the pin junction were checked as shown in Table 3 in the same manner as Example 1.

The p-layers 23 of Examples 4 and 5 were formed in the following manner.

On a transparent conductive film 22, the p-layer 23 containing a crystalline component was deposited to a thickness of 25 nm by plasma enhanced CVD method at a VHF band frequency of 81 MHz under gas flow rates of 4 sccm for SiH$_4$, 0.1 sccm for B$_2$H$_6$ and 120 sccm for H$_2$, a substrate temperature of 240° C., an applied power of 25 W and a pressure of 27 Pa.

From Table 3, it is found that enhancement of the preferential crystal orientation of the p-layer formed as a bottom layer allowed enhancement of the preferential crystal orientation of the pin junction. Further, Table 4 shows that the photovoltaic conversion efficiency of the thin film solar cell including the pin junction with the thus enhanced preferential crystal orientation was more improved.

Even if the i-layer was formed under the conditions which increase the deposition rate while deteriorating the preferential crystal orientation of the i-layer as a single layer, the preferential crystal orientation of the pin junction was compensated by the use of the p-layer having a stronger crystal preferential crystal orientation as that of Example 4. Thus, the thin film solar cell having greater photovoltaic conversion efficiency was manufactured.

EXAMPLE 6 AND COMPARATIVE EXAMPLE 1

Thin film solar cells of Example 6 and Comparative Example 1 were formed as shown in FIG. 1 in substantially the same manner as Example 1 except that the crystal properties of the p-layer 23 were varied. Then, characteristics of the thin film solar cells were checked as shown in Table 4 so as to evaluate the improvement of the crystal properties of the i-layer caused by the p-layer located under the i-layer. Characteristics of a single p-layer and the pin junction were checked as shown in Table 3 in the same manner as Example 1.

The crystal properties of the single p-layer 23 were varied by changing the applied power to 50 W in Example 6 and 75 W in Comparative Example 1.

Table 3 shows that when the p-layer formed as a bottom layer showed the preferential crystal orientation as seen in Example 6, the pin junction could have a preferential crystal orientation even if the i-layer had a random orientation when deposited as a single layer. However, as in Comparative Example 1, where the bottom p-layer showed the random orientation, the pin junction also exhibited the random orientation, so that the photovoltaic conversion efficiency of the thin film solar cell was deteriorated.

TABLE 3

| | Preferential orientation of p-layer (500 nm) $I_{220}/I_{111}$ | Crystal fraction of p-layer (500 nm) Ic/(Ic + Ia) | Preferential orientation of i-layer (500 nm) $I_{220}/I_{111}$ | Crystal fraction of i-layer (500 nm) Ic/(Ic + Ia) | Preferential orientation of pin junction (500 nm) $I_{220}/I_{111}$ | Crystal fraction of pin junction (500 nm) Ic/(Ic + Ia) |
|---|---|---|---|---|---|---|
| Ex. 1 | 11 | 0.58 | 0.8 | 0.82 | 4 | 0.82 |
| Ex. 2 | 11 | 0.58 | 3.6 | 0.78 | 28 | 0.78 |
| Ex. 3 | 11 | 0.58 | 1.6 | 0.80 | 12 | 0.80 |
| Ex. 4 | 15 | 0.68 | 0.8 | 0.82 | 8 | 0.82 |
| Ex. 5 | 15 | 0.68 | 3.6 | 0.78 | 38 | 0.78 |
| Ex. 6 | 3.8 | 0.66 | 0.8 | 0.82 | 1.4 | 0.82 |
| Com. Ex. 1 | 0.9 | 0.74 | 0.8 | 0.82 | 0.8 | 0.82 |

TABLE 4

| | Open-circuit voltage (V) | Density of short-circuit current (mA/cm$^2$) | Fill Factor | Photovoltaic conversion efficiency (%) |
|---|---|---|---|---|
| Ex. 1 | 0.50 | 23.0 | 0.71 | 8.2 |
| Ex. 2 | 0.52 | 23.8 | 0.74 | 9.2 |
| Ex. 3 | 0.51 | 23.3 | 0.72 | 8.6 |
| Ex. 4 | 0.51 | 23.5 | 0.72 | 8.6 |
| Ex. 5 | 0.54 | 24.2 | 0.75 | 9.8 |
| Ex. 6 | 0.48 | 22.8 | 0.70 | 7.7 |
| Com. Ex. 1 | 0.42 | 22.5 | 0.62 | 5.9 |

TABLE 6

| | Open-circuit voltage (V) | Density of short-circuit current (mA/cm$^2$) | Fill factor | Photovoltaic conversion efficiency (%) |
|---|---|---|---|---|
| Ex. 1 | 0.50 | 23.0 | 0.71 | 8.2 |
| Ex. 7 | 0.46 | 22.5 | 0.67 | 7.0 |
| Ex. 8 | 0.49 | 23.0 | 0.70 | 7.9 |
| Ex. 9 | 0.47 | 22.5 | 0.67 | 7.2 |
| Ex. 10 | 0.46 | 22.1 | 0.65 | 6.6 |
| Com. Ex. 1 | 0.42 | 22.5 | 0.62 | 5.9 |
| Com. Ex. 2 | 0.38 | 19.3 | 0.52 | 3.8 |

EXAMPLES 7–10 AND COMPARATIVE EXAMPLE 2

Thin film solar cells of Examples 7–10 and Comparative Example 2 were formed as shown in FIG. 1 in substantially the same manner as Example 1 except that the p-type impurity concentration in the p-layer 23 was varied. Then, characteristics of the thin film solar cells were checked as shown in Table 6 to clarify the characteristics required to the p-layer formed as a bottom layer. Characteristics of a single p-layer and the pin junction were checked as shown in Table 5 in the same manner as Example 1.

The boron concentrations in the p-layer 23 shown in Table 5 were obtained by suitably changing the concentration of a $B_2H_6$ gas in a gas phase during the film formation. For example, the $B_2H_6$ gas concentration was set to about 0.5% to obtain the boron concentration of 1.0% in the p-layer of Example 8.

As seen in Table 5, where the single p-layer formed as the bottom layer had the boron concentration of 0.2 to 8 atom %, the integrated intensity ratio $I_{220}/I_{111}$ of the X-ray diffraction peak at (220) with respect to that of (111) when deposited to a thickness of 500 nm was 1 or more. That is, the p-layer showed the preferential orientation in the direction of (110) and had the crystal fraction Ic/(Ic+Ia) of more than 0.4.

From Table 6, the crystal fraction of the pin junction was maintained to the same degree as that of the single i-layer. Even if the single i-layer showed the random orientation, the pin junction showed the preferential orientation, which indicated that the characteristics of the thin film solar cell was excellent.

On the other hand, where the boron concentration in the p-layer was lower than 0.2 atom %, the preferential crystal orientation was not expressed in the single p-layer. Where the boron concentration is higher than 8 atom %, the crystallization of the single p-layer was unsatisfactory and the p-type impurities were diffused into the i-layer, which deteriorated the characteristics of the thin film solar cell.

TABLE 5

| | Boron concentration in p-layer (atom %) | Preferential orientation of p-layer (500 nm) $I_{220}/I_{111}$ | Crystal fraction of p-layer (500 nm) Ic/(Ic + Ia) | Preferential orientation of pin junction $I_{220}/I_{111}$ | Crystal fraction of pin junction Ic/(Ic + Ia) |
|---|---|---|---|---|---|
| Ex. 1 | 0.5 | 11 | 0.58 | 4 | 0.82 |
| Ex. 7 | 0.2 | 4.8 | 0.72 | 1.8 | 0.82 |
| Ex. 8 | 1.0 | 9.8 | 0.68 | 3.6 | 0.82 |
| Ex. 9 | 5.0 | 7.3 | 0.70 | 2.7 | 0.82 |
| Ex. 10 | 8.0 | 4.2 | 0.74 | 1.5 | 0.82 |
| Com. Ex. 1 | 0.1 | 0.9 | 0.74 | 0.8 | 0.82 |
| Com. Ex. 2 | 10.0 | 1.4 | 0.38 | 1.2 | 0.82 |

EXAMPLES 11–15 AND COMPARATIVE EXAMPLES 3–4

Thin film solar cells of Examples 11–15 and Comparative Examples 3–4 were formed as shown in FIG. 1 in the same manner as Example 1 except that the thickness of the p-layer 23 was varied. Then, characteristics of the thin film solar cells were checked as shown in Table 8 in order to clarify the characteristics required to the p-layer formed as the bottom layer. Characteristics of the pin junction were also checked as shown in Table 7 in the same manner as Example 1.

TABLE 7

|  | Thickness of p-layer (nm) | Preferential orientation of pin junction $I_{220}/I_{111}$ | Crystal fraction of pin junction $Ic/(Ic + Ia)$ |
| --- | --- | --- | --- |
| Ex. 1 | 25 | 4 | 0.82 |
| Ex. 11 | 10 | 2 | 0.82 |
| Ex. 12 | 40 | 4.4 | 0.82 |
| Ex. 13 | 70 | 4.5 | 0.82 |
| Ex. 14 | 100 | 4.6 | 0.82 |
| Ex. 15 | 200 | 4.8 | 0.82 |
| Com. Ex. 3 | 7 | 0.9 | 0.82 |
| Com. Ex. 4 | 250 | 4.8 | 0.78 |

TABLE 8

|  | Open-circuit voltage (V) | Density of short-circuit current (mA/cm$^2$) | Fill factor | Photovoltaic conversion efficiency (%) |
| --- | --- | --- | --- | --- |
| Ex. 1 | 0.50 | 23.0 | 0.71 | 8.2 |
| Ex. 11 | 0.46 | 24.2 | 0.67 | 7.5 |
| Ex. 12 | 0.51 | 22.1 | 0.72 | 8.1 |
| Ex. 13 | 0.50 | 21.2 | 0.71 | 7.5 |
| Ex. 14 | 0.49 | 20.7 | 0.70 | 7.1 |
| Ex. 15 | 0.48 | 20.2 | 0.68 | 6.7 |
| Com. Ex. 3 | 0.37 | 22.1 | 0.51 | 4.2 |
| Com. Ex. 4 | 0.47 | 19.3 | 0.60 | 5.4 |

From Tables 7 and 8, where the thickness of the p-layer at the bottom was in the range of 10 to 200 nm, the integrated intensity ratio $I_{220}/I_{111}$ was large so that the pin junction having the preferential crystal orientation was obtained, i.e., the characteristics of the thin film solar cell was excellent. On the other hand, where the thickness of the p-layer was smaller than 10 nm, no preferential crystal orientation was obtained in the pin junction, and where the thickness of the p-layer was larger than 200 nm, the short-circuit current was reduced. That is, the characteristics of the thin film solar cell was deteriorated.

EXAMPLE 16

Figure 2:
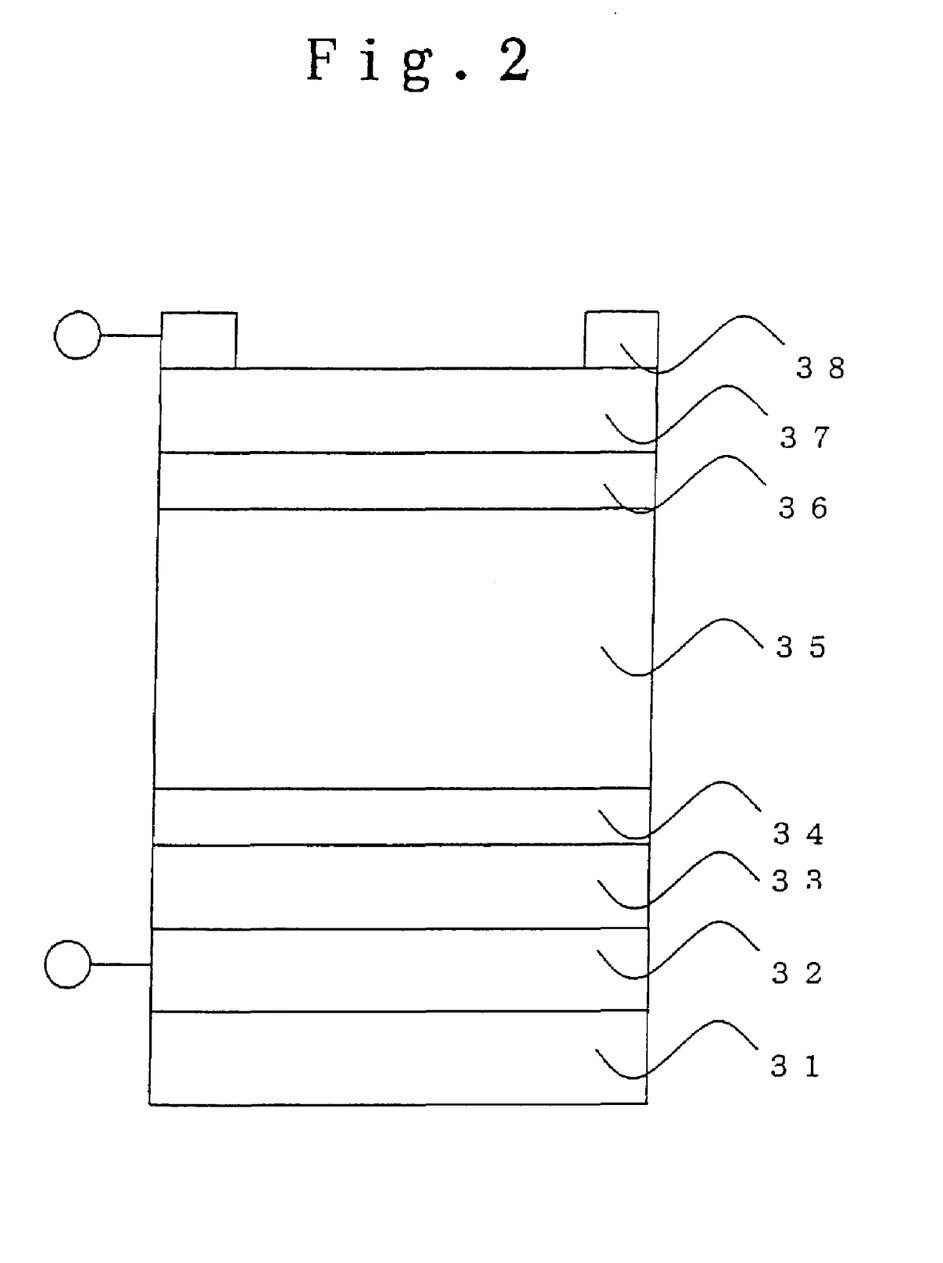
FIG. 2 is a schematic sectional view illustrating a major part of another example of the thin film solar cell according to the present invention.

In this example, the thin film solar cell shown in FIG. 2 was manufactured in the following steps.

On a glass plate 31 of 3 mm thick, Ag was deposited to a thickness of 400 nm by sputtering as a back electrode 32 and then a ZnO film of 100 nm thick was formed thereon by sputtering as a back reflective layer 33.

On the back reflective layer 33, a thin film of p-type silicon (a p-layer) 34 containing a crystalline component was deposited to a thickness of 25 nm by RF plasma enhanced CVD at 13 MHz under gas flow rates of 4 sccm for $SiH_4$, 0.1 sccm for $B_2H_6$ and 40 sccm for $H_2$, a substrate temperature of 140° C. and a pressure of 27 Pa (the conditions for Example 1).

Then, on the p-layer 34, a thin film of intrinsic silicon (an i-layer) 35 containing a crystalline component was deposited to a thickness of 1.5 μm by RF plasma enhanced CVD at 13 MHz under gas flow rates of 5 sccm for $SiH_4$ and 90 sccm for $H_2$, a substrate temperature of 200° C., an applied power of 50 W and a pressure of 40 Pa (the conditions for Example 2).

On the i-layer 35, a thin film of n-type silicon (an n-layer) 36 was deposited to a thickness of 15 nm by RF plasma enhanced CVD under gas flow rates of 4 sccm for $SiH_4$, 0.01 sccm for $PH_3$ and 100 sccm for $H_2$, a substrate temperature of 190° C., an applied power of 25 W and a pressure of 33 Pa (the conditions for Example 1).

Crystal fraction of the thus manufactured pin junction was 0.82 and the integrated intensity ratio of the X-ray diffraction peak at (220) with respect to that at (111) was 4.

On the n-layer 36, an ITO film of 100 nm thick was formed by sputtering as a transparent conductive film 37.

On the transparent conductive film 37, an Ag film of 300 nm thick was formed by vacuum vapor deposition as a metal electrode 38 in the shape of a comb so that electric current was. extracted therefrom.

Characteristics of the thus manufactured solar cell element of a substrate type in which light enters from the transparent conductive film 37 were checked as shown in Table 9. The obtained solar cell element had an efficient irradiation area of 1 cm$^2$. The photovoltaic conversion efficiency was measured by irradiating the solar cell element with pseudo-sunbeam sunbeam of AM 1.5 and 100 mW/cm$^2$.

TABLE 9

|  | Preferential orientation of pin junction $I_{220}/I_{111}$ | Crystal fraction of pin junction $Ic/(Ic + Ia)$ | Open-circuit voltage (V) | Density of short-circuit current (mA/cm$^2$) | Fill factor | Photovoltaic conversion efficiency (%) |
| --- | --- | --- | --- | --- | --- | --- |
| Ex. 2 | 28 | 0.78 | 0.52 | 23.8 | 0.74 | 9.2 |
| Ex. 16 | 26 | 0.78 | 0.51 | 23.2 | 0.72 | 8.5 |

Table 9 shows that if the solar cell element was of a substrate type, high photovoltaic conversion efficiency was obtained by providing the p-layer having a greater preferential crystal orientation at the bottom.

EXAMPLE 17

In this example, the thin film solar cell as shown in FIG. 1 was manufactured in the following steps.

A substrate 28 was the same as that of Example 1.

On a transparent conductive film 22, a thin film of p-type silicon (a p-layer) 23 containing a crystalline component was deposited to a thickness of 25 nm by RF plasma enhanced CVD at 13 MHz under gas flow rates of 4 sccm for $SiH_4$, 0.1 sccm for $B_2H_6$ and 40 sccm for $H_2$, a substrate temperature of 140° C., an applied power of 25 W and a pressure of 27 Pa. While maintaining the plasma, the $B_2H_6$ gas was stopped and a thin intrinsic silicon film (an i-layer) 24 containing a crystalline component was continuously deposited to a thickness of 1.5 μm under gas flow rates of 5 sccm for $SiH_4$ and 90 sccm for $H_2$, a substrate temperature of 200° C., an applied power of 50 W and an inner. pressure of 40 Pa (the conditions for Example 2).

Further, a thin film of n-type silicon (an n-layer) 25 was formed on the i-layer 24 in the same manner as Example 1.

As seen in Table 10, the crystal fraction of the thus obtained pin junction was 0.78 and the integrated intensity ratio of the X-ray diffraction peak at (220) with respect to that at (111) was 39.

On the n-layer 25, a back reflective layer 26 and a back electrode 27 were formed in the same manner as Example 1.

Characteristics of the thus manufactured solar cell element were checked as shown in Table 10.

TABLE 10

|  | Preferential orientation of pin junction $I_{220}/I_{111}$ | Crystal fraction of pin junction Ic/(Ic + Ia) | Open-circuit voltage (V) | Density of short-circuit current (mA/cm$^2$) | Fill factor | Photovoltaic conversion efficiency (%) |
|---|---|---|---|---|---|---|
| Ex. 2 | 28 | 0.78 | 0.52 | 23.8 | 0.71 | 9.2 |
| Ex. 17 | 39 | 0.78 | 0.55 | 24.0 | 0.73 | 9.6 |

Table 10 shows that the integrated intensity ratio $I_{220}/I_{111}$ of the X-ray diffraction peak of the pin junction was further increased by the continuous formation of the p-layer and the i-layer, so that the characteristics of the thin film solar cell was also improved.

EXAMPLE 18

In this example, the thin film solar cell shown in FIG. 1 was manufactured in the following steps.

A substrate 28 was the same as that used in Example 1.

On a transparent conductive film 22, a thin film of p-type silicon (a p-layer) 23 was deposited in the same manner as Example 1 and then the substrate is transported into a chamber for depositing a thin film of intrinsic silicon (an i-layer) 24. In the i-layer deposition chamber, plasma was generated for 30 seconds under a gas flow rate of 90 sccm for $H_2$, a substrate temperature of 200° C., an applied power of 50 W and a pressure of 40 Pa. Then, a thin film of intrinsic silicon (an i-layer) 24 containing a crystalline component was deposited on the p-layer 23 to a thickness of 1.5 μm under the same conditions as employed in Example 2.

On the i-layer 24, a thin film of n-type silicon (an n-layer) 25 was formed in the same manner as Example 2.

As seen in Table 11, the crystal fraction of the thus obtained pin junction was 0.78 and the integrated intensity ratio of the X-ray diffraction peak at (220) with respect to that at (111) was 34.

On the n-layer 25, a back reflective layer 26 and a back electrode 27 were formed in the same manner as Example 1.

Characteristics of the thus manufactured solar cell element were checked as shown in Table 11.

TABLE 11

|  | Preferential orientation of pin junction $I_{220}/I_{111}$ | Crystal fraction of pin junction Ic/(Ic + Ia) | Open-circuit voltage (V) | Density of short-circuit current (mA/cm$^2$) | Fill factor | Photovoltaic conversion efficiency (%) |
|---|---|---|---|---|---|---|
| Ex. 2 | 28 | 0.78 | 0.52 | 23.8 | 0.74 | 9.2 |
| Ex. 18 | 34 | 0.78 | 0.53 | 23.8 | 0.75 | 9.5 |

Table 11 shows that the integrated intensity ratio $I_{220}/I_{111}$ of the X-ray diffraction peak of the pin junction was further increased by exposing the surface of the p-layer to atomic hydrogen before the formation of the i-layer, so that the characteristics of the thin film solar cell was also improved.

According to the present invention, a thin film solar cell is comprised of a p-layer, an i-layer and an n-layer formed as a pin junction on a substrate, the p-layer and the i-layer are silicon thin films each containing a crystalline component and the p-layer contains p-type impurities of 0.2 to 8 atom % and has a thickness of 10 to 200 nm. Thus, the preferential crystal orientation of the p-layer is remarkably enhanced and the preferential crystal orientation of the i-layer formed thereon is also improved, which allows obtaining a high efficiency thin film solar cell.

Further, according to the present invention, a thin film solar cell is comprised of the p-layer, i-layer and n-layer formed as the pin junction on the substrate, the p-layer and the i-layer are silicon thin films each containing a crystalline component and the p-layer shows the integrated intensity ratio $I_{220}/I_{111}$ of the X-ray diffraction peak at (220) with respect to that at (111) greater than the integrated intensity ratio of the i-layer deposited as a single layer on a substrate. Accordingly, the pin junction includes the p-layer having a strong preferential crystal orientation as the bottom layer so that the high crystal fraction originally exhibited by a single i-layer and the strong preferential crystal orientation originally expressed by a single p-layer are both satisfied. Thus, a photoelectric conversion layer suitable for the stacking is obtained, which allows providing a thin film solar cell with high photovoltaic conversion efficiency. Further, according to the thus constructed thin film solar cell, the preferential crystal orientation of the i-layer is controlled by the p-layer formed at the bottom, so that the i-layer is formed under a greater discharge power and a smaller amount of diluent hydrogen, which improves the film deposition rate. Thus, productivity is highly improved.

In particular, the photovoltaic conversion efficiency is further enhanced in the cases where the p-layer, when deposited as a single layer to a thickness of 500 nm or more on a substrate, shows the preferential crystal orientation in the direction of <110>, preferably, the integrated intensity ratio $I_{220}/I_{111}$ of the X-ray diffraction peak at (220) with respect to that at (111) of 5 or more, where the pin junction formed on the substrate shows the integrated intensity ratio $I_{220}/I_{111}$ of the X-ray diffraction peak at (220) with respect to that at (111) of 1 or more, preferably 5 or more, and where the p-layer, the i-layer and the n-layer are provided in this order on a transparent substrate and light enters from the transparent substrate.

Further, in the case where the p-layer and the i-layer are continuously formed by plasma enhanced CVD while varying the gas flow rate, the thin film solar cell of high efficiency is easily provided. Moreover, since the same film formation chamber can be used for forming the two layers, while separate chambers have been used in general, costs for equipment are reduced and throughput is improved.

According to the present invention, the p-layer is exposed to atomic hydrogen after the formation thereof. Therefore, the crystal properties of the i-layer to be formed on the p-layer are further improved.

Still according to the present invention, a thin film solar cell is comprised of a bottom layer and an upper layer formed directly on the bottom layer in a multi-layered pin junction or a multi-layered nip junction in which both layers contain a crystalline component, respectively, and the bottom layer shows a preferential orientation greater than a preferential orientation of the upper layer deposited as a single layer to the same thickness on a substrate. Alternatively, the upper layer, when deposited as a single layer on a substrate, shows the crystal fraction greater than that of the bottom layer and the stacked structure of the bottom layer and the upper layer in the pin junction or the nip junction shows the integrated intensity ratio $I_{220}/I_{111}$ of the X-ray diffraction peak at (220) with respect to that at (111) of 5 or more. Therefore, the preferential orientation of the bottom layer is taken over by the upper layer. As a result, a high quality photoelectric conversion layer is obtained, which allows obtaining a thin film solar cell of much greater photovoltaic conversion efficiency.

In particular, where the bottom layer is formed by plasma enhanced CVD utilizing VHF frequency band as an excitation frequency, the thin film solar cell with excellent photovoltaic conversion efficiency as mentioned above is easily manufactured.

Further, according to the present invention, the thin film solar cell is provided with the transparent conductive film, the p-layer, the i-layer and the n-layer formed in this order on the transparent substrate and light enters from the transparent substrate. Accordingly, a so-called superstrate structure is employed so that problems such as the reduction in transmissivity and moisture resistance are solved depending on the kind of transparent substrate.

Thus, if the thin film solar cell of the present invention is used as a solar cell module, a longlife solar cell module having high photovoltaic conversion efficiency which is stable over a long-term light irradiation is obtained since the photoelectric conversion layer of the thin film solar cell exhibits both of the high crystal fraction and the high preferential crystal orientation.

Therefore, the thin film solar cell can be applied as a solar-electric power generator for domestic use which is exposed outside. Further, the solar cells can be commonly utilized in power generation.

What is claimed is:

1. A method of making a solar cell including a p-layer, an i-layer and an n-layer formed in this order as a pin junction on a substrate, the method comprising:
    forming the p-layer, the i-layer, and the n-layer in this order on the substrate, wherein the p-layer and the i-layer comprise thin films including silicon and each contains a crystalline component;
    wherein the p-layer comprises p-type impurities of 0.2 to 8 atom % and has a thickness of 10–200 nm; and
    wherein the p-layer and the i-layer are continuously formed by plasma enhanced CVD while maintaining plasma and while varying a gas flow rate.

2. The method of claim 1, wherein a surface of the p-layer is exposed to atomic hydrogen after formation of the p-layer.

3. The method of claim 1, wherein the p-layer is formed of a film which shows an integrated intensity ratio of the X-ray diffraction peak at (220) with respect to the X-ray diffraction peak at (111) of 5 or more, when the deposited as a single layer to a thickness of 500 nm or more on a substrate.

4. The method of claim 1, wherein the p-layer is formed by plasma enhanced CVD using a VHF frequency band as an excitation frequency.

5. A method of making a solar cell, the method comprising:
    forming a p-layer, an i-layer and an n-layer on a substrate;
    wherein the p-layer and the i-layer each comprise silicon and each comprises a crystalline component;
    forming the p-layer so that it contains impurities of 0.2–8 atomic % and has a thickness of 10–200 nm; and
    wherein the p-layer has an integrated intensity ratio of the X-ray diffraction peak at (220) with respect to the X-ray diffraction peak at (111) at least 3.055 times as large as that of the i-layer deposited as a single layer to the same thickness on a substrate.

* * * * *